US006218075B1

(12) United States Patent
Kimura et al.

(10) Patent No.: US 6,218,075 B1
(45) Date of Patent: Apr. 17, 2001

(54) PHOTOSENSITIVE LITHOGRAPHIC PRINTING PLATE

(75) Inventors: Takeshi Kimura; Osamu Fujita, both of Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/139,409

(22) Filed: Aug. 25, 1998

(30) Foreign Application Priority Data

Aug. 26, 1997 (JP) .................. 9-229785

(51) Int. Cl.[7] .................. G03F 7/09

(52) U.S. Cl. .................. 430/276.1; 430/159; 430/160; 430/278.1; 101/466

(58) Field of Search .................. 101/466; 430/276.1, 430/525, 49, 69, 159, 160, 278.1

(56) References Cited

U.S. PATENT DOCUMENTS 3,754,599 * 8/1973 Hummel et al. .................. 166/297
4,383,897 * 5/1983 Gillich et al. .................. 204/33
4,427,765 * 1/1984 Mohr et al. .................. 430/525
4,448,647 * 5/1984 Gillich et al. .................. 204/33
5,637,441 * 6/1997 Brenk et al. .................. 430/278.1

FOREIGN PATENT DOCUMENTS 0 774 692A2 * 5/1997 (EP) .................. 430/160
93/15156 * 8/1993 (WO) .................. 430/160
WO95/09384 4/1995 (WO) .

* cited by examiner

*Primary Examiner*—Cynthia Hamilton
(74) *Attorney, Agent, or Firm*—Burns, Doane, Swecker & Mathis, LLP

(57) ABSTRACT

A photosensitive lithographic printing plate has an aluminum support anodized and treated with an aqueous solution of polyvinylphosphonic acid adjusted to pH 1.5 or below to ensure no deterioration of impression capacity and prevention of the water-ink balance scum in the lithographic printing plate made therefrom even when a cleaner is used in the course of printing.

4 Claims, No Drawings

PHOTOSENSITIVE LITHOGRAPHIC PRINTING PLATE

FIELD OF THE INVENTION

The present invention relates to a photosensitive lithographic printing plate which is prepared by subjecting an anodized aluminum support to an after-treatment and then providing thereon a photosensitive layer.

BACKGROUND OF THE INVENTION

In a conventional manner to make a lithographic printing plate, a photosensitive lithographic printing plate having a thin coating of photosensitive composition on an aluminum plate is exposed imagewise and then developed. The aluminum plate to be used as a support for the lithographic plate generally undergoes a surface roughening treatment using a mechanical method, such as a brush graining method or a ball graining method, an electrochemical method such as an electrolytic graining method, or a combination of mechanical and electrochemical methods, and thereby it comes to have a rough surface like a pear skin. The thus surface-roughened aluminum plate is etched with an aqueous solution of acid or alkali and then anodized. Further, the anodized aluminum plate may receive some treatment for improving water wettability, if needed. On the support prepared in the aforementioned manner, a photosensitive layer is provided to form a photosensitive lithographic printing plate (the so-called presensitized plate). In general such a presensitized plate is subjected successively to imagewise exposure, development and gumming processes to be made into a lithographic printing plate. This lithographic printing plate is mounted in a press, and printing operations are carried out.

As the photosensitive lithographic printing plates to provide lithographic printing plates, there are those of a positive working type and a negative working type.

The positive working photosensitive compositions which have widely been used are compositions comprising o-quinonediazide compounds. Such a photosensitive compound alone or a mixture with an alkali-soluble resin, such as a novolak-type phenol or cresol resin, is coated on a support. In a case where the support used has a water receptive surface, the exposed area of the coating is easily removed with an alkali developer since it changes to soluble in alkali due to decomposition of the o-quinonediazide compound, and thereby the water receptive surface of the support is bared. This bared area of the support receives water but repels ink; while the unexposed area remaining as an image is lipophilic, and so it can receive ink.

With respect to the negative working photosensitive compositions, there are many cases in which a diazonium salt, an azide compound or a photopolymerizing compound is used as photosensitive component. Such a photosensitive component is coated on a support singly or as a mixture with an additive such as an appropriate resin. When a support having a water receptive surface is used, the unexposed area of the coating is removed with a developer to reveal the water receptive surface of the support. This area receives water and repels ink. On the other hand, the area cured by exposure remains as an image upon development, and can receive ink because of its lipophilic properties.

As a method of preparing a support having a water receptive surface, the following are known: the method disclosed in U.S. Pat. No. 3,181,461 wherein the anodized layer is treated with an aqueous alkali metal silicate, the method disclosed in JP-A-2-185493 (the term "JP-A" as used herein means an "unexamined published Japanese patent application") wherein the anodized aluminum plate is treated with an aqueous solution containing an alkali metal silicate and a hydroxide, the method described in JP-B-46-35685 (the term "JP-B" as used herein means an "examined Japanese patent publication") wherein the anodized aluminum plate is treated with an aqueous solution of polyvinylphosphonic acid, the method described in JP-A-60-194096 wherein the anodized aluminum material is treated with an aqueous solution of alkali metal silicate, and then with an aqueous solution containing at least one organic polymer having vinylphosphonic acid units and/or vinylmethylphosphinic acid units, the method disclosed in WO 9509384 wherein water wettability is given to an aluminum plate by treating the plate with an aqueous solution of polyvinylphosphonic acid neutralized to pH 2.5–6.6 with an alkali, and the method disclosed in WO 9509086 wherein the mechanically or/and electrically grained aluminum plate is treated with an aqueous solution of polyvinylphosphonic acid neutralized to pH 2.5–6.6 with an alkali to pH 2.5–6.6 to acquire water wettability.

Those methods for conferring water wettability on a support surface have some problems to solve. For instance, poor inking (water log) due to excess of water and ink spreading in the shadow part of an image can occur due to an excess of ink on the lithographic printing plate at the same time depending upon positions along the width direction in a printing machine, thereby failing in providing prints of good quality. In still another case where a great number of copies are printed, stains are generated on the prints with the progress of printing operations since the non-image area of the plate is gradually rendered hydrophobic by the printing ink. In order to recover from this hydrophobic condition, a cleaner containing as main components a support etching agent, such as phosphoric acid, and an ink dissolving agent, such as an aliphatic hydrocarbon, is usually employed. However, the use of such a cleaner causes deterioration of impression capacity in negative working presensitized plates formed using as the support a material which has undergone anodic oxidation and then treatment with an aqueous solution of alkali metal silicate, because the adhesion between the photosensitive layer and the support is weakened by the cleaner. In other negative working presensitized plates formed using as the support an aluminum plate which has undergone anodic oxidation and then treatment with an aqueous solution of polyvinylphosphonic acid adjusted to pH 2.5 or higher, the cleaner used has no bad effect on their impression capacity, but in the case where water is used in a reduced amount as compared with a standard amount, the tendency of causing stains by ink spreading in the image area and stains in the non-image area on prints is increased, and when the amount of water is increased after the stains generate in image area or non-image area, the tendency of causing the prints to suffer from the stains (so-called "water-ink balance scum") is increased. In still another case as described in Example 1 of JP-A-60-194096, where the negative working presensitized plate is formed using the support which has been anodized and then treated with an aqueous solution of alkali metal silicate and further undergone after-treatment with an aqueous solution of polyvinylphosphonic acid, the use of the cleaner causes deterioration of impression capacity, in analogy with the case of using the support treated with an aqueous solution of alkali metal silicate alone.

SUMMARY OF THE INVENTION

Therefore, an object of the present invention is to provide a lithographic printing plate which suffers no deterioration in impression capacity and is free from deterioration of the water-ink balance scum even when a cleaner is used upon printing.

As a result of our intensive studies of the subject mentioned above, it has been found that the present object can be attained with a photosensitive lithographic printing plate having an aluminum support anodized and then treated with an aqueous solution of polyvinylphosphonic acid adjusted to pH 1.5 or below, thereby achieving the present invention.

DETAILED DESCRIPTION OF THE INVENTION

The main reason for attainment of the present object is probably explained as follows: The surface of an aluminum support is first activated by the etching with an acidic aqueous solution, and thereto a polyvinylphosphonic acid is adsorbed. As the aqueous solution used herein has a very low pH value, the polyvinylphosphonic acid can be adsorbed on the support surface in a large amount, compared with the case of using an aqueous solution having a relatively high pH value, and so the support surface is covered with the polyvinylphosphonic acid to acquire sufficient water wettability. Even when a cleaner is used, on the other hand, such a rather thick covering of the polyvinylphosphonic acid inhibits the cleaner from penetrating into the interface of the photosensitive layer and the support. Thus, the adhesion between the support and the photosensitive layer undergoes no deterioration, and so the lithographic printing plate suffers no deterioration in impression capacity and, at the same time, the non-image area can retain sufficient water wettability to be free from deterioration of the water-ink balance scum.

Treatment with Aqueous Solution of Polyvinylphosphonic Acid

The polyvinylphosphonic acid concentration in the aqueous solution used for the treatment with an aqueous solution of polyvinylphosphonic acid after the anodic oxidation treatment is generally from 0.01 to 10% by weight, desirably from 0.1 to 5% by weight, and more desirably from 0.2 to 2.5% by weight. For adjusting the pH of the aqueous solution to 1.5 or below, any acid may be used. Examples of an acid usable therefor include sulfuric acid, nitric acid, hydrochloric acid, other strong acids, and salts thereof. The temperature of the aqueous solution treatment is preferably from 10° C. to 70° C., more preferably from 30° C. to 60° C. The time for dipping in such an aqueous solution is preferably from 0.5 to 40 seconds, more preferably from 1 to 20 seconds.

When the aqueous solution of polyvinylphosphonic acid has a concentration lower than 0.01% by weight, the polyvinylphosphonic acid adsorbed on the anodized layer is too small in quantity to produce sufficient effect on prevention of the water-ink balance scum and to provide impression capacity; while, when the polyvinylphosphonic acid concentration is higher than 10% by weight, the treatment cost becomes too high. When the pH of the aqueous solution of polyvinylphosphonic acid exceeds 1.5, the amount of polyvinylphosphonic acid adsorbed on the support surface becomes so insufficient that the water-ink balance scum cannot be prevented to a satisfactory extent. When the treatment temperature is lower than 10° C., the polyvinylphosphonic acid adsorbed on the anodized layer is too small in quantity to produce sufficient effect on prevention of the water-ink balance scum and to provide impression capacity; while, even when the temperature is raised to above 70° C., the treatment cannot enhance the effect on the prevention of the water-ink balance scum. When the dipping time is less than 0.5 second, the polyvinylphosphonic acid adsorbed on the anodized layer is too small in quantity to produce sufficient effect on prevention of the water-ink balance scum and to provide impression capacity; while the dipping time longer than 40 seconds has a bad influence upon productivity.

The amount of polyvinylphosphonic acid adsorbed on the support surface by the treatment of the present invention is preferably at least 0.25, expressed in terms of the atomic density ratio (P/Al).

Measurement of Amount of Polyvinylphosphonic Acid Adsorbed

The amount of polyvinylphosphonic acid adsorbed on the support surface, expressed in terms of the atomic density ratio (P/Al), is calculated from the spectral intensities of these elements, measured with ESCA, Model PHI-5400MC, produced by Perkin-Elmer Co., Ltd. and the sensitivity coefficient of each element.

Aluminum Plate

The aluminum plate used in the present invention is a plate-form pure aluminum, a plate-form aluminum alloy containing trace amounts of foreign atoms, or the like.

Such foreign atoms include silicon, iron, manganese, copper, magnesium, chromium, zinc, bismuth, nickel, titanium and so on. The content of foreign atoms in such an aluminum alloy is not greater than 10% by weight. The most suitable aluminum for the present invention is pure aluminum, but the completely pure aluminum is difficult to produce from the viewpoint of scouring technique. Although it is desirable to use an aluminum plate containing foreign atoms in the lowest possible amounts, the aluminum alloy plate in which foreign atoms are present to the extent of 10% by weight or less may be used as a support material of the present invention. Therefore, the aluminum plate used in the present invention has no particular restriction as to its composition, but any of well-known, generally used materials may be employed properly. Preferred examples of the material include JIS A 1050, JIS A 1100, JIS A 1200, JIS A 3003, JIS A 3103 and JIS A 3005. The thickness of an aluminum plate used is from about 0.1 mm to about 0.5 mm.

Prior to the anodic oxidation of an aluminum plate, the aluminum plate is optionally subjected to a degreasing treatment with, e.g., a surfactant or an alkaline aqueous solution in order to remove a rolling oil from the surface of the aluminum plate, and then to a graining treatment.

Graining Treatment

The graining treatment can be effected by adopting a method of mechanically roughening the surface, a method of electrochemically dissolving the surface or a method of performing selective dissolution of the surface with a chemical means. As the method of mechanically roughening the surface, known methods including a ball abrasion method, a brush abrasion method, a blast abrasion method and a buff abrasion method can be adopted. As for the method of electrochemically roughening the surface, there is a method of soaking an aluminum plate in a hydrochloric or nitric acid electrolyte and passing therethrough a direct or alternating electric current to render the plate surface rough. Also, both the above-cited mechanically and electrochemically roughening methods can be used in combination, as disclosed in JP-A-54-63902.

The thus roughened aluminum plate may undergo an alkali etching treatment and a neutralizing treatment, if desired.

Anodic Oxidation Treatment

Any electrolyte can be used for the anodic oxidation treatment of the aluminum plate as long as it can form a porous oxidized film on the aluminum plate. In general sulfuric acid, phosphoric acid, oxalic acid, chromic acid or a mixture of two or more thereof is used as the electrolyte. The electrolyte concentration can be properly chosen depending on the species of the electrolyte used.

The conditions under which the anodic oxidation is carried out vary depending on the electrolyte used, and so it is impossible to absolutely specify the conditions. In general, however, anodic oxidation can be achieved effectively under the conditions where the concentration of an electrolytic solution used is from 1 to 80% by weight, the solution temperature is from 5° C. to 70° C., the electric current density is from 5 to 60 A/$dm^2$, the voltage is from 1 to 100 V and the electrolysis time is from 10 seconds to 50 minutes. Of these treatments, the anodic oxidation in sulfuric acid under the condition of a high electric current density as described in GB Patent 1,412,768, and the anodic oxidation in diluted sulfuric acid as described in U.S. Pat. No. 4,211,619 are preferable. In particular, it is effective to perform the anodic oxidation treatment in an 25–50° C. electrolyte containing 5–20% by weight of sulfuric acid and 3–15% by weight of aluminum ion by passing therethrough a direct current at a current density of 5 to 20 A/$dm^2$.

Thus, the anodized layer can be formed at a coverage rate of 0.1 to 10 g/$m^2$.

Water Receptive Subbing Layer

Examples of a water receptive subbing layer usable in the present invention include the water receptive layer disclosed in JP-A-60-149491, which comprises a compound having at least one amino group and at least one group selected from a carboxyl group and salts thereof, and a sulfo group and salts thereof; the water receptive layer disclosed in JP-A-60-232998, which comprises a compound having at least one amino group and at least one hydroxyl group or a salt thereof; the water receptive layer disclosed in JP-A-62-19494, in which a phosphate is contained; the water receptive layer disclosed in JP-A-59-101651, which comprises a high molecular compound at least one repeating unit of which is a sulfo group-containing monomer unit; and the organic layer disclosed in JP-A-4-282637, which comprises at least one compound selected from the substituted or unsubstituted aliphatic or aromatic compounds represented by $R^1(PO(OH)_2)_n$ or $R^1—(PO(OH)(R^2))_n$ wherein n is 1 or 2, in the case of n=1, $R^1$ and $R^2$ each are a substituted or unsubstituted alkyl, alkoxy, aryloxy, aryl, acyl or acyloxy group and, in the case of n=2, $R^1$ is a substituted or unsubstituted alkylene or arylene group and $R^2$ has the same meaning as in the case of n=1.

Photosensitive Layer

The photosensitive layer used in the present invention can have any composition as long as the composition can change its solubility or swellability in a developer by exposure to light. The representatives of such compositions are illustrated below.

(A) Photosensitive Layer Comprising o-Quinonediazide Compound

Examples of a photosensitive compound to be incorporated in a positive working photosensitive composition include an o-quinonediazide compound. The typical example thereof includes an o-naphthoquinonediazide compound.

The o-naphthoquinonediazide compound is preferably an ester prepared from 1,2-diazonaphthoquinonesulfonic acid chloride and pyrogallol-acetone resins as described in JP-B-43-28403. Examples of other o-quinonediazide compounds include the esters prepared from 1,2-diazonaphthoquinonesulfonic acid chloride and phenol-formaldehyde resins described in U.S. Pat. Nos. 3,046,120 and 3,188,210. Furthermore, many other useful o-quinonediazide compounds are known by disclosure in patents. For instance, such compounds are disclosed in JP-A-47-5303, JP-A-48-63802, JP-A-48-63803, JP-A-48-96575, JP-A-49-38701, JP-A-48-13354, JP-B-37-18015, JP-B-41-11222, JP-B-45-9610, JP-B-49-17481, U.S. Pat. Nos. 2,797,213, 3,454,400, 3,544,323, 3,573,917, 3,674,495 and 3,785,825, GB Patents 1,227,602, 1,251,345, 1,267,005, 1,329,888 and 1,330,932, and German Patent 854,890.

Also, the o-naphthoquinonediazide compound prepared by reaction of a polyhydroxy compound having a molecular weight of 1,000 or below with 1,2-diazonaphthoquinonesulfonic acid chloride can be used. Examples of such a compound include those described in JP-A-51-139402, JP-A-58-150948, JP-A-58-203434, JP-A-59-165053, JP-A-60-121445, JP-A-60-134235, JP-A-60-163043, JP-A-61-118744, JP-A-62-10645, JP-A-62-10646, JP-A-62-153950, JP-A-62-178562, JP-A-64-76047, and U.S. Pat. Nos. 3,102,809, 3,126,281, 3,130,047, 3,148,983, 3,184,310, 3,188,210 and 4,639,406.

In preparing those o-naphthoquinonediazide compounds, it is desirable that 0.2 to 1.2 equivalents, preferably 0.3 to 1.0 equivalents, of 1,2-diazonaphthoquinonesulfonic acid chloride be allowed to react with one equivalent of the hydroxyl groups of a polyhydroxy compound. As 1,2-diazonaphthoquinonesulfonic acid chloride, 1,2-diazonaphthoquinone-5-sulfonic acid chloride is preferred. However, 1,2-diazonaphthoquinone-4-sulfonic acid chloride may also be used.

The thus prepared o-naphthoquinonediazide compound is a mixture of compounds differing in position and amount of the 1,2-diazonaphthoquinonesulfonate groups introduced. In this mixture, it is desirable that the compound corresponding to conversion of all hydroxyl groups of the starting polyhydroxy compound into 1,2-diazonaphthoquinonesulfonate groups (completely esterified compound) be present in a proportion of at least 5 mole %, more preferably from 20 to 99 mole %.

Besides o-naphthoquinonediazide compounds, the polymer compounds having o-nitrocarbinol ester groups described in JP-B-56-2696 can be used as other positive working photosensitive compounds.

Further, the combination of a compound capable of generating an acid by photolysis with a compound having a acid-decomposable —C—O—C— or —C—C—Si— group can be employed in the present invention.

Examples of a compound of the foregoing type which is used in combination with a compound capable of generating an acid by photolysis include the acetal or O, N-acetal compounds (JP-A-48-89003), the ortho ester or amidoacetal compounds (JP-A- 51-120714), the polymers having acetal or ketal groups in their main chain (JP-A-53-133429), the enol ether compounds (JP-A-55-12995), the N-acyliminocarbon compounds (JP-A-55-126236), the polymers having ortho ester groups in their main chain (JP-A-56-17345), the silyl ester compounds (JP-A-60-10247) and the silyl ether compounds (JP-A-60-37549 and JP-A-60-121446).

The proportion of such a positive working photosensitive compound (including a combination as recited above) in a photosensitive composition usable in the present invention is generally from 10 to 50% by weight, preferably from 15 to 40% by weight.

Although the o-quinonediazide compound may be a sole constituent of a photosensitive layer, it is desirable that the photosensitive layer be formed using an o-quinonediazide compound in combination with a resin soluble in aqueous alkali as a binder. The resin soluble in aqueous alkali which can be used as binder includes novolak resins having such a property. More specifically, the resins which can be contained in the photosensitive layer include various kinds of alkali-soluble high molecular compounds, such as a phenol-formaldehyde resin, cresol-formaldehyde resins (e.g., m-cresol-formaldehyde resin, p-cresol-formaldehyde resin, m-cresol/p-cresol mixture-formaldehyde resin, and phenol/cresol mixture-formaldehyde resin wherein the cresol may be m-cresol, p-cresol or m-cresol/p-cresol mixture), a phenol-modified xylene resin, a poly(hydroxystyrene), a poly(halohydroxystyrene), the acrylic resin having phenolic hydroxyl groups as disclosed in JP-A-51-34711, the acrylic resin having sulfonamido groups described in JP-A-2-866, and urethane resins. It is desirable for these alkali-soluble high molecular compounds to have a weight average molecular weight in the range of 500 to 20,000 and a number average molecular weight in the range of 200 to 60,000.

Such an alkali-soluble high molecular compound is used in a proportion of 70% by weight or less to the total photosensitive composition.

Further, it is desirable from the viewpoint of heightening the ink receptivity of images as described in U.S. Pat. No. 4,123,279 that the condensate produced from formaldehyde and a $C_{3-8}$ alkyl-substituted phenol, such as t-butylphenol-formaldehyde resin or octylphenol-formaldehyde resin, or the o-naphthoquinonediazidesulfonic acid ester (e.g., those described in JP-A-61-243446) of such a condensate be used in combination with the alkali-soluble high molecular compound as recited above.

To a photosensitive composition used in the present invention can be added a cyclic acid anhydride for increasing the sensitivity, a printing-out agent for obtaining a visible image immediately after exposure, dyes as an image-coloring agent, fillers and so on. Examples of a cyclic acid anhydride include, as described in U.S. Pat. No. 4,115,128, phthalic anhydride, tetrahydrophthalic anhydride, hexahydrophthalic anhydride, 3,6-endoxo-Δ4-tetrahydrophthalic anhydride, tetrachlorophthalic anhydride, maleic anhydride, chloromaleic anhydride, α-phenylmaleic anhydride, succinic anhydride and pyromellitic anhydride. When such a cyclic acid anhydride is added in a proportion of from 1 to 15% by weight to the total photosensitive composition, the sensitivity can be tripled at the maximum. As a printing-out agent for providing visible images immediately after exposure, the combination of a photosensitive compound capable of releasing an acid by exposure and an organic dye capable of forming a salt can be typically used. Examples of a printing-out agent of such a type include the combinations of o-naphthoquinonediazide-4-sulfonic acid halides with salt-forming organic dyes described in JP-A-50-36209 and JP-A-53-8128, and the combinations of trihalomethyl compounds with salt-forming organic dyes described in JP-A-53-36223, JP-A-54-74728, JP-A-60-3626, JP-A-61-143748, JP-A-61-151644 and JP-A-63-58440. As the image-coloring agent, besides the foregoing salt-forming organic dyes, other dyes can be employed. As suitable examples of such dyes, including salt-forming organic dyes, mention may be made of oil-soluble dyes and basic dyes. More specifically, those dyes include Oil Yellow #101, Oil Yellow #130, Oil Pink #312, Oil Green BG, Oil Blue BOS, Oil Blue #603, Oil Black BY, Oil Black BS, Oil Black T-505 (which are the products of Orient Chemical Industries Co., Ltd.), Victoria Pure Blue, Crystal Violet (CI42555), Ethyl Violet (CI42600), Methyl Violet (CI42535), Rhodamine B (CI45170B), Malachite Green (CI42000) and Methylene Blue (CI52015). Further, the dyes described in JP-A-62-293247 can be used to particular advantage.

The photosensitive composition as mentioned above is dissolved in a solvent capable of dissolving the ingredients as recited above, and coated on a support. Examples of a solvent usable herein include ethylene dichloride, cyclohexanone, methyl ethyl ketone, ethylene glycol monomethyl ether, ethylene glycol monoethyl ether, 2-methoxyethylacetate, 1-methoxy-2-propanol, 1-methoxy-2-propylacetate, toluene, ethyl acetate, methyl lactate, ethyl lactate, dimethyl sulfoxide, dimethyl acetamide, dimethylformamide, water, N-methylpyrrolidone, tetrahydrofurfuryl alcohol, acetone, diacetone alcohol, methanol, ethanol, isopropanol, diethylene glycol and dimethyl ether. These solvents are used alone or as a mixture of two or more thereof. The suitable concentration of the foregoing ingredients (solids) in the solution is generally from 2 to 50% by weight. In general, the coverage rate of solids depends on the use intended, and so the coverage rate ranging from 0.5 to 3.0 $g/m^2$ is appropriate in the case of a photosensitive lithographic printing plate. Although the sensitivity is increased with a decrease in coverage rate, the physical properties of the photosensitive coating undergo deterioration.

To the present photosensitive composition can be added surfactants for improving the coatability, e.g., the fluorine-containing surfactants described in JP-A-62-170950. The suitable proportion of such surfactants in the total photosensitive composition is preferably from 0.01 to 1% by weight, more preferably from 0.05 to 0.5% by weight.

(B) Photosensitive Layer Comprising Diazo Resin and Binder

As negative working photosensitive diazo compounds, the so-called photosensitive diazo resins, or the condensation products of formaldehyde and diphenylamine-p-diazonium salts as reaction products of diazonium salts with reactive carbonyl group-containing organic condensation agents such as aldols and acetals, as disclosed in U.S. Pat. Nos. 2,063,631 and 2,667,415, can be used to advantage. Other useful condensed diazo compounds are those disclosed in JP-B-49-48001, JP-B-49-45322 and JP-B-49-45323. In general the photosensitive diazo compounds of these types are obtained in the form of water-soluble inorganic salt, so that they can be coated as an aqueous solution. On the other hand, those water-soluble diazo compounds can be made to react with aromatic or aliphatic compounds having at least one phenolic hydroxyl or sulfonic acid group, or both of them in accordance with the method disclosed in JP-B-47-1167 to obtain substantially water-insoluble photosensitive diazo resins. The thus obtained diazo resins can also be used.

Further, they can be used as products of the reaction with hexafluorophosphates or tetrafluoroborates, as described in JP-A-56-121031.

Examples of a reactant having at least one phenolic hydroxyl group include hydroxybenzophenones, 4,4-bis(4'-hydroxyphenyl)pentanoic acid, resorcinol and diphenolic acids as diresorcinol. These compounds may further have substituents. The hydroxybenzophenones include 2,4-dihydroxybenzophenone, 2-hydroxy-4-methoxybenzophenone, 2,2'-dihydroxy-4,4'-dimethoxybenzophenone and 2,2',4,4'-tetrahydroxybenzophenone. Suitable examples of a compound having at least one sulfonic acid group include aromatic sulfonic acids, such as benzenesulfonic acid, toluenesulfonic acid, xylenesulfonic acid, naphthalenesulfonic acid, phenolsulfonic acid and benzophenonesulfonic acid, and soluble salts thereof, such as ammonium salts and alkali metal salts thereof. In general these sulfonic acid group-containing compounds may be substituted with a lower alkyl group, a nitro group, a halo group and/or another sulfonic acid group. Of these compounds, benzenesulfonic acid, toluenesulfonic acid, naphthalenesulfonic acid, 2,5-dimethylbenzenesulfonic acid, sodium benzenesulfonate, naphthalene-2-sulfonic acid, 1-naphthol-2(or 4)-sulfonic acid, 2,4-dinitro-1-naphthol-7-sulfonic acid, 2-hydroxy-4-methoxybenzophenone-5-sulfonic acid, sodium m-(p'-anilinophenylazo)benzenesulfonate, alizarinsulfonic acid, o-toluidine-m-sulfonic acid and ethanesulfonic acid are preferably used. In addition, the sulfonic acid esters of alcohols and salts thereof are also useful. In general these compounds are easily available as anionic surfactant. These anionic surfactants include ammonium or alkali metal salts of lauryl sulfate, alkylaryl sulfates, p-nonylphenyl sulfate, 2-phenylethyl sulfate and isooctylphenoxydiethoxyethyl sulfate.

Such a substantially water-insoluble photosensitive diazo resin can be isolated as precipitates by mixing a water-soluble diazo resin and an aqueous solution of aromatic or aliphatic compound as recited above, desirably in almost equal amounts by mole.

In addition, the diazo resins described in GB Patent 1,312,925 are advantageously used.

Further, the oxyacid phosphor group-containing diazo resins described in JP-A-3-253857, the diazo resin condensed with a carboxyl group-containing aldehyde or acetal compound described in JP-A-4-18559 and the diazo resins obtained by copolymerization with carboxyl group-containing aromatic compounds, including phenoxyacetic acid, described in JP-A-4-211253 are desirable, too.

The most suitable diazo resin is 2-methoxy-4-hydroxy-5-benzoylbenzenesulfonate, which is a condensate of p-diazodiphenylamine and formaldehyde.

It is appropriate to contain such a diazo resin as recited above in a proportion of from 5 to 50% by weight in a photosensitive layer. When the proportion of a diazo resin is lowered, the sensitivity is heightened but the storage stability is lowered. Therefore, the optimum content of a diazo resin is in the range of about 8 to about 20% by weight.

On the other hand, various high molecular compounds can be used as binder. In the present invention, however, high molecular compounds having hydroxyl, amino, carboxylic acid, amido, sulfonamido, active methylene, thioalcohol, epoxy or like groups are desirably used. Examples of such a desirable binder include the shellac described in GB Patent 1,350,521, the polymers containing hydroxyethylacrylate units or hydroxyethylmethacrylate units as main repeating units as described in GB Patent 1,460,973 and U.S. Pat. No. 4,123,276, the polyamide resins described in U.S. Pat. No. 3,751,257, the phenol resins and the polyvinylacetal resins, such as polyvinylformal and polyvinylbutyral resins, described in GB Patent 1,074,392, and the high molecular compounds described in U.S. Pat. No. 3,660,097, including linear polyurethane resins, phthaloylated resins of polyvinyl alcohol, epoxy resins produced by condensation of bisphenol A and epichlorohydrin, amino group-containing polymers such as polyaminosulfone and polyalkylamino(meth)acrylates, and cellulose derivatives such as cellulose acetate, cellulose alkyl ethers and cellulose acetate phthalate.

The composition comprising a diazo resin and a binder can further contain additives, including the pH indicators as described in GB Patent 1,041,463, and phosphoric acid and dyes as described in U.S. Pat. No. 3,236,646.

(C) Photosensitive Layer Comprising Azide Compound and Binder (High Molecular Compound)

Examples of a composition forming the present photosensitive layer include the compositions comprising the azide compounds described in GB Patents 1,235,281 and 1,495,861, JP-A-51-32331 and JP-A-51-36128 and water-soluble or alkali-soluble high molecular compounds, and the compositions comprising the azido group-containing polymers described in JP-A-50-5102, JP-A-50-84302, JP-A-50-84303 and JP-A-53-12984 and high molecular compounds as binders.

(D) Other Photopolymer Layers

Examples of a photopolymer which can constitute the present photosensitive layer include the polyester compounds disclosed in JP-A-52-96696, the polyvinyl cinnamate resins described in GB Patents 1,112,277, 1,313,390, 1,341,004 and 1,377,747, the photopolymerizing photopolymer compositions described in U.S. Pat. Nos. 4,072,528 and 4,072,527, and JP-A-2-244050, and silver-triggered polymerizing composition described in JP-A-7-28248.

(E) Electrophotographic Photosensitive Layer

The electrophotographic photosensitive layer is constituted mainly of a photoconductive compound and a binder. For the purposes of increasing the sensitivity, providing the intended sensitive wavelength region and so on, known pigments, dyes, chemical sensitizers and other additives can be used therein, if needed. The sensitive layer may be a single layer, or it may be a multiple layer wherein the charge generating function and the charge transporting function are performed by separate constituent layers. The lithographic printing plate can be prepared by forming a toner image on the photosensitive layer by a known electrophotographic process and decoding the non-image area by using the toner image as resist layer. The photosensitive layers of such a type are described, e.g., in JP-B-37-17162, JP-A-38-6961, JP-A-56-107246, JP-A-60-254142, JP-B-59-36259, JP-B-59-25217, JP-A-56-146145, JP-A-62-194257, JP-A-57-147656, JP-A-58-100862 and JP-A-57-161863, and many other publications. In the present invention, any of these layers can be used to advantage.

The photosensitive layer can be used generally in a thickness of from 0.1 to 30 μm, preferably from 0.5 to 10 μm. The amount of the photosensitive layer (solids) provided on a support is appropriately from 0.1 to 7 $g/m^2$, preferably from 0.5 to 4 $g/m^2$. For the purpose of shortening the suction time and preventing unsharp printing upon contact exposure using a vacuum printing frame, it is desirable that the surface of the photosensitive layer provided as mentioned above be rendered matte. For instance, the surface can be rendered matte by forming thereon the matte layer as described in JP-A-50-125805, JP-B-57-6582 and JP-B-61-28986, or by attaching solid particles thereto by heat fusing as described in JP-B-62-62337.

Each of the present photosensitive lithographic printing plates as mentioned above undergoes imagewise exposure, and then conventional processing, including development, to be formed into a lithographic printing plate.

More specifically, the positive working lithographic printing plate having Photosensitive Layer (A) is developed with the aqueous alkali solution as described in U.S. Pat. No. 4,259,434 or JP-A-3-90388 after imagewise exposure, and thereby the photosensitive layer is removed in the exposed area to provide a lithographic printing plate.

On the other hand, the negative working lithographic printing plate having Photosensitive Layer (B), which comprises a diazo resin and a binder, is developed with the developer described, e.g., in U.S. Pat. No. 4,186,006 after imagewise exposure, and thereby the photosensitive layer is removed in the non-image area to provide a lithographic printing plate.

As a matter of course, the present photosensitive lithographic printing plates each may undergo the prepress processing described in JP-A-54-8002, JP-A-55-11504 or JP-A-59-58431. More specifically, the prepress processing may be the combination of developing, washing and desensitizing steps, the combination of developing and desensitizing steps, the combination of a developing step and a step of processing with an acid-containing aqueous solution, or the combination of a developing step, a step of processing with an acid-containing aqueous solution and a desensitizing step. Further, when the processing capacity in such a developing step is dropped by reduction in alkali concentration due to consumption of the aqueous alkali solution depending on the amount of photosensitive lithographic printing plates processed, or due to contact with air during the long-range operation of an automatic developing machine, the processing capacity can be restored by addition of a fresh unused developer (replenisher) or a replenisher having higher alkalinity as described in JP-A-54-62004. In this case, it is desirable that the replenisher be added in an amount proportional to the one-side length of a presensitized plate processed or the replenishment be carried out by the method described in U.S. Pat. No. 4,882,246.

Further, it is desirable that the prepress processing as mentioned above be performed with the automatic developing machine as described in JP-A-2-7054 or JP-A-2-32357.

In a case where the deletion of an unnecessary part in the image area is required after the present photosensitive lithographic printing plate is subjected to imagewise exposure, development, and then wash or rinse, it is desirable to use the deletion fluid as described in JP-B-2-13293. As for the desensitizing gum which is, if desired, coated at the final stage of prepress processing, the gum solutions described in JP-B-62-16834, JP-B-62-25118, JP-B-63-52600, JP-A-62-7595, JP-A-62-11693 and JP-A-62-83194 are used to advantage.

In a case where the present photosensitive lithographic printing plate is subjected to a burning-in treatment after undergoing imagewise exposure, development, wash or rinse and then, if needed, deletion and wash, it is desirable that the treatment with the burning conditioner as described in JP-B-61-2518, JP-B-55-28062, JP-A-62-31859 or JP-A-61-159655 be carried out prior to the burning-in treatment.

Now, the present invention will be illustrated in more detail by reference to the following examples. Unless otherwise noted in the examples, all % are by weight.

EXAMPLES 1 TO 3

The surface of a JIS 1050 aluminum sheet was subjected to a brush graining treatment using a rotary nylon brush while supplying thereto an aqueous suspension of pumice. The thus grained aluminum sheet had a surface roughness of 0.5 $\mu$m (expressed in center-line average roughness Ra). After it was washed, the aluminum sheet was etched by dipping in 10% aqueous sodium hydroxide heated to 70° C. until the aluminum dissolved amounted to 6 g/m$^2$, and then washed. Further, the etched sheet was neutralized by 1-minute dipping in a 30% aqueous solution of nitric acid, and thoroughly rinsed with water. Furthermore, the resulting sheet was subjected to a 20-second electrolytic surface-roughening treatment in a 0.7% aqueous solution of nitric acid under the square-wave alternating electric potential having an anode voltage of 13 volt and a cathode voltage of 6 volt. The thus roughened surface was cleaned by dipping in a 20% solution of sulfuric acid heated to 50° C., and then washed. Furthermore, the aluminum sheet was anodically oxidized in a 20% aqueous solution of sulfuric acid by sending thereto a direct electric current at the current density of 5 A/dm$^2$, and the porous anodized layer having a weight of 2.5 g/m$^2$ was obtained by controlling the electrolysis time, thereby preparing a substrate [Substrate (I)].

A 0.5% aqueous solution of polyvinylphosphonic acid were divided into three portions, and adjusted to pH 0.7, 1.0 and 1.2 respectively by addition of small different amounts of sulfuric acid, and heated to 60° C. Substrate (I) was treated for 10 seconds with each of the thus prepared solutions to prepare three substrate samples. On each of the three substrate samples thus prepared, the photosensitive composition set forth below was coated so as to have a dry coverage rate of 1.5 g/m$^2$, and dried to provide a photosensitive layer.

| Photosensitive Composition | |
|---|---|
| Polyurethane resin (a) synthesized by the method described below | 5 g |
| Dodecylbenzensulfonic acid salt of condensation product of 4-diazodiphenylamine and formaldehyde | 1.2 g |
| Propane-1,2,3-tricarboxylic acid | 0.05 g |
| Phosphoric acid | 0.05 g |
| 4-Sulfophthalic acid | 0.05 g |
| Tricresyl phosphate | 0.25 g |
| Styrene-maleic anhydride copolymer half esterified with n-hexanol | 0.1 g |
| Naphthalenesulfonic acid salt of Victoria Pure Blue BOH | 0.18 g |
| Compound represented by $[C_6F_{17}C_2H_2CH_2O]_{1.7}PO[OH]_{1.3}$ | 0.015 g |
| Megafac F-177 (fluorine-containing surfactant produced by Dai-Nippon Ink & Chemicals Inc.) | 0.06 g |
| 1-Methoxy-2-propanol | 20 g |
| Methanol | 40 g |
| Methyl ethyl ketone | 40 g |
| Ion exchange water | 1 g |

Synthesis Method of Polyurethane Resin (a)

In a 500 ml three neck round-bottom flask equipped with a condenser and a stirrer, 11.5 g (0.0860 mole) of 2,2-bis(hydroxymethyl)propionic acid, 7.26 g (0.0684 mole) of diethylene glycol and 4.11 g (0.0456 mole) of 1,4-butanediol were placed, and dissolved in 118 g of N,N-dimethylacetamide. Thereto, 30.8 g (0.123 mole) of 4,4'-diphenylmethane-diisocyanate, 13.8 g (0.0819 mole) of hexamethylenediisocyanate and 0.1 g of di-n-butyltin dilaurate as a catalyst were added, and heated for 7 hours at 90° C. with stirring. To the thus obtained reaction solution were added 100 ml of N,N-dimethylacetamide, 50 ml of methanol and 50 ml of acetic acid. After stirring, the resulting solution was poured into 4 liter of water with stirring to precipitate a white polymer. This polymer was filtered off, rinsed with water, and dried under reduced pressure. Thus, 62 g of polymer (Polyurethane resin (a)) was obtained.

After imagewise exposure and development subsequent thereto, each of the lithographic printing plates obtained was mounted in a printing machine (Komori Sprint 25), and underwent printing operations with printing ink, Process ink produced by Dainippon Ink & Chemicals, Inc. and a fountain solution containing 10% isopropanol and 2.3% of Rosos G7A (fountain solution condensate produced by Rosos Co.).

In order to evaluate the water-ink balance scum, the normal printing was performed using the foregoing printing machine under a condition of the water scale of 5, then the surface of each plate sample was rendered scummy by lowering the water scale to 2, and further the amount of water supply was increased so that the water scale was returned to 5, followed by examining for the extent of stains on the printings obtained. Thereafter, though wiped with a cleaner CL-1 (a product of Fuji Photo Film Co., Ltd.) every printing of 5,000 copies, each plate enabled the printing of up to 50,000 copies. The pH of the aqueous solution of polyvinylphosphonic acid used for treatment of the substrate, the amount of polyvinylphosphonic acid adsorbed to the substrate surface and the water-ink balance scum upon printing are shown in Table 1.

COMPARATIVE EXAMPLES 1 TO 3

The same processing and printing operations as in Example 1 were performed, except that the 0.5% aqueous solution of polyvinylphosphonic acid divided into three portions were adjusted to pH 2.0, 2.5 and 6.0 respectively. Also, the pH of the aqueous solution of polyvinylphosphonic acid used for treatment of the substrate, the amount of polyvinylphosphonic acid adsorbed to the substrate surface and the examination result of the water-ink balance scum upon printing are shown in Table 1.

COMPARATIVE EXAMPLE 4

The same processing and printing operations as in Example 1 were performed, except that the Substrate (I) was treated with a 2.5% aqueous solution of sodium silicate for 12 seconds at 70° C. and then washed, and further coated with the same photosensitive composition as used in Example 1 so as to have a dry coverage of 2.5 $g/m^2$ and then dried. The water-ink balance scum upon printing was examined in the same procedure as in Example 1, and the result thereof is also shown in Table 1.

TABLE 1

| | pH of aq. soln. of polyvinyl-phosphonic acid | Amount of poly-vinylphosphonic acid adsorbed | Effect upon prevention of water-ink balance scum |
|---|---|---|---|
| Example 1 | 0.7 | 0.41 | A |
| Example 2 | 1.0 | 0.31 | A |
| Example 3 | 1.2 | 0.28 | A |
| Comparative Example 1 | 2.0 | 0.21 | C |
| Comparative Example 2 | 2.5 | 0.17 | C |
| Comparative Example 3 | 6.0 | 0.16 | C |
| Comparative Example 4 | — | 0 | C |

By the marks used in Table 1 for evaluating the effect upon the prevention of the water-ink balance scum, the following are referred to:

A : No scum

B : Some scum

C : Much scum

As can be seen from Table 1, the polyvinylphosphonic acid was adsorbed in greater amounts by the photosensitive lithographic printing plates processed in accordance with the present invention than by those processed in conventional manners, so that the present lithographic printing plates produced excellent effect upon prevention of the water-ink balance scum.

In accordance with the present invention, photosensitive lithographic printing plate having improved effect on the prevention of the water-ink balance scum can be provided.

While the invention has been described in detail and with reference to specific embodiments thereof, it will be apparent to one skilled in the art that various changes and modifications can be made therein without departing from the spirit and scope thereof.

What is claimed is:

1. A photosensitive lithographic printing plate having an aluminum support anodized and, after the anodization, treated with an aqueous solution of polyvinylphosphonic acid containing $H_2SO_4$ and having a pH of 1.5 or below.

2. The photosensitive lithographic printing plate of claim 1, wherein the concentration of the aqueous solution of polyvinylphosphonic acid was from 0.01 to 10% by weight.

3. The photosensitive lithographic printing plate of claim 1, wherein the aluminum support was treated with the aqueous solution of polyvinylphosphonic acid such that the amount of polyvinylphosphonic acid adsorbed on the surface of the support was not less than 0.25 in terms of the atomic density ratio of P:Al.

4. The photosensitive lithographic printing plate of claim 1, wherein the aluminum support was anodized to provide an anodized layer having 0.1 to 10 $g/m^2$.

* * * * *